United States Patent
Yamada et al.

(12)
(10) Patent No.: US 6,349,872 B1
(45) Date of Patent: Feb. 26, 2002

(54) PACKAGING METHOD

(75) Inventors: Yukio Yamada; Hiroyuki Fujihira; Motohide Takeichi, all of Kanuma (JP)

(73) Assignee: Sony Chemicals Corp., Tokyo (JP)

( * ) Notice: Subject to any disclaimer, the term of this patent is extended or adjusted under 35 U.S.C. 154(b) by 0 days.

(21) Appl. No.: 09/549,204

(22) Filed: Apr. 13, 2000

(30) Foreign Application Priority Data

Apr. 26, 1999 (JP) .............................. 11-118651

(51) Int. Cl.[7] .......................... B23K 31/02; B32B 31/00
(52) U.S. Cl. .................. 228/175; 228/180.22; 228/215; 156/60; 156/145; 156/290
(58) Field of Search ............................ 228/175, 180.22, 228/214, 215, 227, 228; 156/60, 145, 290, 321, 379.9

(56) References Cited

U.S. PATENT DOCUMENTS

| 5,325,583 A | * | 7/1994 | Shimizu et al. |
| 5,468,440 A | * | 11/1995 | McAlpin et al. |
| 5,692,940 A | * | 12/1997 | Kinabara et al. |
| 5,771,157 A | * | 6/1998 | Zak |
| 6,006,427 A | * | 12/1999 | Zak |
| 6,069,097 A | * | 5/2000 | Suzuki et al. |

FOREIGN PATENT DOCUMENTS

JP 02000312069 A * 11/2000

* cited by examiner

*Primary Examiner*—Tom Dunn
*Assistant Examiner*—Kiley Stoner
(74) *Attorney, Agent, or Firm*—Oliff & Berridge, PLC

(57) ABSTRACT

Substrate warpage is eliminated without adversely affecting connection reliability when an IC chip or other packaging component is mounted on a substrate by thermocompression bonding with an interposed thermosetting adhesive. In a packaging method for the thermocompression bonding of a substrate and an IC chip or other packaging component between a stage and a head by means of an interposed thermosetting adhesive, the temperature of the stage during thermocompression bonding is set above the temperature corresponding to the inflection point of the elastic modulus in the relationship between the elastic modulus and the temperature of the cured adhesive.

6 Claims, 2 Drawing Sheets

PACKAGING METHOD

BACKGROUND OF THE INVENTION

1. Field of the Invention

The present invention relates to a packaging method for the thermocompression bonding of a substrate and packaging components between a stage and a head by means of an interposed thermosetting adhesive.

2. Description of the Related Art

Methods in which substrates and packaging components are bonded under heat and pressure by means of interposed anisotropic conductive films (ACFs), anisotropic conductive pastes (ACPs), nonconductive films (NCFs), and other thermosetting adhesives are known as methods for mounting IC chips and other packaging components on substrates. For example, an IC chip 3 mounted on a glass substrate 1 by means of an interposed thermosetting adhesive 2 is heated and pressed between a stage 4 and a head 5 in a COG (Chip-On-Glass) assembly obtained by mounting an IC chip on the glass substrate of an LCD panel, as shown in FIG. 1. In this case, the temperature of the head 5 is commonly set to between 150 and 350° C. In addition, the stage 4 is kept at normal temperature to prevent the thermosetting reaction of the thermosetting adhesive 2 from starting too early. An alternative is to heat the stage to a temperature below the reaction start temperature (40 to 60° C.) in order to prevent the connection temperature from varying from one thermocompression cycle to another during the mounting step.

Thin glass substrates having low coefficients of linear expansion are commonly used in COG assemblies in order to reduce the weight of the products and to increase mounting density. For example, conventional substrates of 1.1-mm thick are being replaced with substrates of 0.7-mm thick, and conventional substrates whose coefficient of linear expansion α is about $4.8 \times 10^{-6}$ are being replaced with substrates of about $3.1 \times 10^{-6}$.

Using a substrate 1 that is thinner and has a lower α-value disrupts the heat distribution of the thermosetting adhesive 2 when the IC chip 3 is mounted in the manner described above, and the substrate 1 is warped by internal stress, as shown in FIG. 2. Consequently, images become irregular, electrical resistance increases, and other problems occur when such a packaging method is applied to the glass substrate of an LCD panel.

To address these problems, attempts have been made to use low-elasticity products as thermosetting adhesives, and thus to lower the internal stress of the substrates. Using a low-elasticity thermosetting adhesive makes it possible to reduce substrate warpage but brings about the disadvantage of lower connection reliability.

SUMMARY OF THE INVENTION

It is an object of the present invention to overcome the above-described shortcomings of prior art and to prevent substrate warpage without adversely affecting connection reliability when an IC chip or other packaging component is mounted on a substrate under heat and pressure with the aid of a thermosetting adhesive.

The inventors perfected the present invention upon discovering that the stated object can be attained by adopting an arrangement in which the stage used for such thermocompression bonding is heated to a prescribed temperature.

Specifically, the present invention provides a packaging method for the thermocompression bonding of a substrate and packaging components between a stage and a head by means of an interposed thermosetting adhesive, wherein the stage temperature during thermocompression bonding is set above the temperature corresponding to the inflection point of the elastic modulus in the relationship between the elastic modulus and the temperature of the cured adhesive.

As used herein, the term "stage temperature" refers to the surface temperature of the stage on the substrate side.

These and other objects, features and advantages of the present invention are described in or will become apparent from the following detailed description of the invention.

DESCRIPTION OF THE PREFERRED EMBODIMENTS

The present invention will now be described in detail with reference to the drawings.

Figure 1:
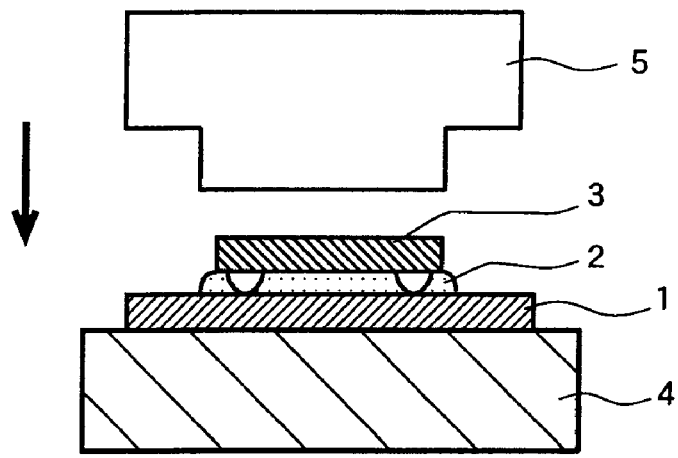
FIG. 1 is a diagram illustrating a conventional packaging method.
Figure 2:
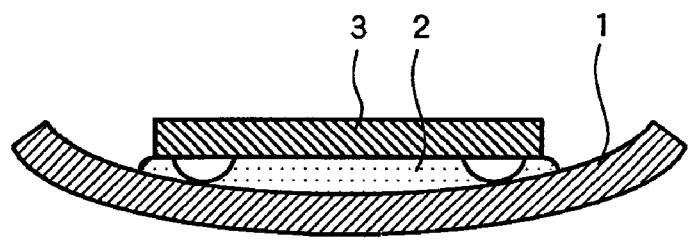
FIG. 2 is a cross section of a substrate deformed by the conventional packaging method.

The present invention resides in a packaging method in which an assembly obtained by placing an IC chip 3 and other packaging components on a substrate 1 by means of an interposed thermosetting adhesive 2 in the manner shown in FIG. 1 is bonded under heat and pressure between a stage 4 and a head 5, wherein the stage temperature during such thermocompression bonding is set above the temperature corresponding to the inflection point of the elastic modulus in the relationship between the elastic modulus and the temperature of the cured adhesive.

Figure 3:
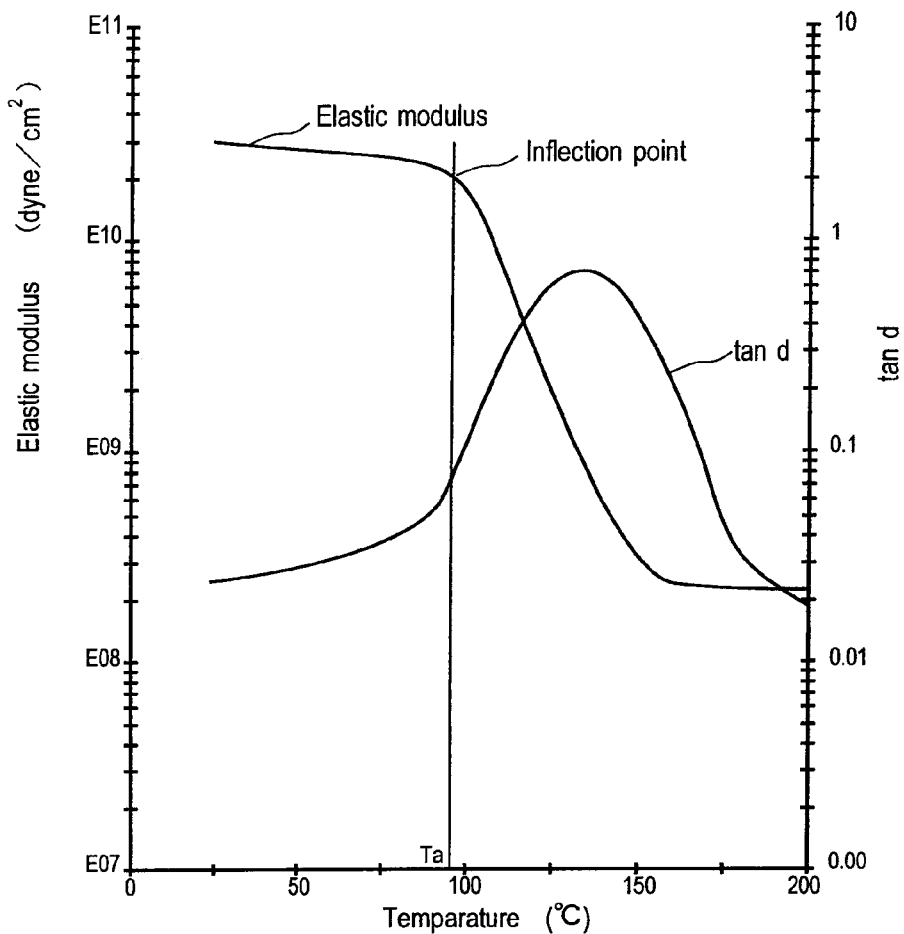
FIG. 3 is a diagram depicting the relationship between the elastic modulus and the temperature of the cured thermosetting adhesive.

Specifically, as indicated by the relationship between temperature and elastic modulus in FIG. 3, the elastic modulus of a cured thermosetting adhesive 2 commonly decreases at a low rate with increased temperature, drops faster when a certain temperature (designated as "inflection point a") has been reached, and remains substantially constant at higher temperatures. In the drawing, the elastic modulus and tan d are values determined with the aid of an automatic dynamic viscoelasticity meter (for example, Rheovibron DDV-II-EP, manufactured by Orientech). In the present invention, the temperature $T_a$ corresponding to the inflection point a of the thermosetting adhesive 2 used is determined in advance by measurements and the like, and the stage temperature during thermocompression bonding is set above the temperature $T_a$ that corresponded to the inflection point a. As a result, the temperature of the substrate 1 is higher than the temperature $T_a$, a constant heat distribution is established, and reduced stress is generated in the thermosetting adhesive 2 in the cooling step that followed the thermocompression bonding step. Warpage of the thermocompression-bonded substrate 2 can therefore be efficiently prevented, and the substrate 2 and the packaging components can remain connected in a highly reliable manner.

An excessively high stage temperature creates thermal stress in the thermosetting adhesive 2 and the substrate 1, and should therefore be set below the maximum temperature achieved by the thermosetting adhesive 2 during thermocompression bonding. The maximum temperature achieved by the thermosetting adhesive 2 during thermocompression bonding is determined by the specifications of the thermosetting adhesive.

A pulse heater containing a ceramic heater, electrical resistance heater, or the like should preferably be used as the stage 4 in order to control the stage temperature as described above. A ceramic heater is particularly preferred because it has good temperature controllability and dimensional stability against heat, allowing adequate temperature control to be achieved, and the surface of the stage 4 to remain flat.

A heater-containing stainless steel block, a ceramic heater, an electrical resistance pulse heater, or the like can be used as the head 5. In the present invention, the substrate 1, the packaging components, and a pressure of 100 to 2000 kg/cm$^2$ per bump and the quantity of heat needed to cure the thermosetting adhesive 2 should preferably be applied by the head 5 to the substrate 1, the packaging components, and the interposed thermosetting adhesive 2 during thermocompression bonding.

The substrate 1 may be a glass substrate, glass epoxy substrate, ceramic substrate, or the like. In particular, the present invention demonstrates a remarkable effect when a substrate having an elastic modulus of 100 GPa or lower (at normal temperature) and a thickness of 1.0 mm or less is used because of considerations related to the deformation of thermocompression-bonded components.

Various ACFs, ACPs, NCFs, and the like may be used as the thermosetting adhesive 2, but using a thermosetting adhesive whose post-curing elastic modulus is 1.0 GPa or higher (at normal temperature) is preferred from the standpoint of conduction reliability and electrical resistance. In addition, an adhesive having a glass transition point $T_g$ of 80° C. or higher, and preferably 100° C. or higher, should be used because of considerations related to the service environment. Examples of thermosetting resin components include urethane resins, unsaturated polyester resins, epoxy resins, and phenol resins. The elastic modulus or glass transition point $T_g$ of the thermosetting adhesive 2 can be controlled by varying the types or adjusting the amounts of such thermosetting resin components.

In addition to the embodiments described above, numerous other embodiments can also be implemented using the present invention as long as the stage temperature maintained during the thermocompression bonding is kept within the prescribed range in the proposed packaging method for the thermocompression bonding of a substrate and packaging components between a stage and a head by means of an interposed thermosetting adhesive. A common example is one in which the substrate 1 is mounted on the stage 4, and heat and pressure are applied by the head 5 from the side of the IC chip 3 in the manner shown in FIG. 1, but the present invention is not limited by this arrangement and includes arrangements in which the positional relation between the substrate 1 and the IC chip 3 is reversed, and heat and pressure are applied by the head 5 from the side of the substrate 1.

EXAMPLES

The present invention will now be described in detail through working examples.

Working Examples 1 to 6, Comparative Examples 1 to 4

A stage and a head, each consisting of a ceramic heater (5 mm×30 mm), were used to mount IC chips (external dimensions: 2 mm×20 mm; thickness: 0.55 mm; bump size: 30 μm×50 μm; bump pitch: 80 μm) on glass substrates under the mounting conditions shown in Table 3. The substrates used consisted of glass substrates (designated as A, B, or C in Table 1) and had aluminum wiring patterns (pattern width: 50 μm; pitch: 80 μm) on their surfaces. Anisotropic conductive films (ACFs) designated as a, b, and c in Table 2 were used as thermosetting adhesives.

TABLE 1

|  | Substrate A (1737, Corning Co.,) | Substrate B (1737, Corning Co.,) | Substrate C (AS, Asahi Glass Co.,) |
|---|---|---|---|
| External dimensions (mm) | 30 × 84 | 30 × 84 | 30 × 84 |
| Thickness (mm) | 0.7 | 1.1 | 0.7 |
| Coefficient of linear expansion α | 3.8 × 10$^{-6}$ | 3.8 × 10$^{-6}$ | 8.1 × 10$^{-6}$ |

TABLE 2

|  | ACF a(*2) | ACF b(*3) | ACF c (*4) |
|---|---|---|---|
| Thickness (μm) | 25 | 25 | 25 |
| Elastic modulus (23° C.) (GPa) | 3 | 1.5 | 0.15 |
| Inflection point temperature (Ta) (° C.)(*1) | 94 | 78 | 52 |
| Glass transition point (Tg) (° C.) | 137 | 118 | 80 |

Note (*1): "Inflection point temperature" is the temperature that corresponds to the inflection point of the elastic modulus and that was determined by measuring the relationship between temperature and elastic modulus by means of an automatic dynamic viscoelasticity meter (Rheovibron DDV-II-EP, manufactured by Orientech) under the measurement conditions described below.
Measurement Conditions
Measurement sample size (between chucks): 30 mm (length), 3 mm (width), 25 μm (thickness)
Measurement frequency: 11 Hz
Temperature increase rate: 3° C./min
Note (*2): "Resin component ACF a" is a phenoxy resin, a phenol novolak epoxy resin, a bisphenol F epoxy resin, or an imidazole-based latent curing agent.
Note (*3): "Resin component ACF b" is a bisphenol A epoxy resin, a rubber-modified epoxy resin, or an imidazole-based latent curing agent.
Note (*4): "Resin component ACF c" is SEBS (styrene/ethylene/butylene/styrene copolymer), a bisphenol A epoxy resin, or an imidazole-based latent curing agent.

Evaluation

After being mounted, IC chips were evaluated for (i) substrate warpage and (ii) conduction reliability in the manner described below. The results are shown in Table 3.

(i) Substrate Warpage

Figure 4:
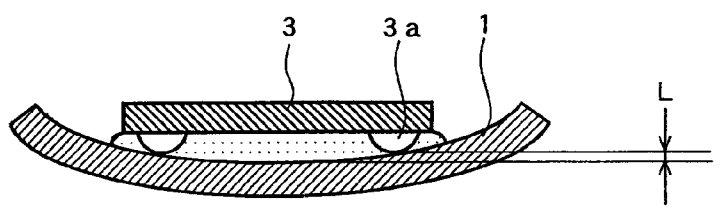
FIG. 4 is a diagram illustrating the substrate warpage following IC chip mounting.

A substrate 1 carrying an IC chip 3 was placed on a flat platform as shown in FIG. 4, and the height L between the area of maximum curvature on the upper surface of the substrate 1 and the contact end face of the bump 3a was measured and used as a warpage index.

(ii) Conduction Reliability

The resistance between two adjacent pins on a substrate 1 was measured before and after a 1000-hour THT test (Thermal Humidity Test) at a temperature of 85° C. and a humidity of 85% RH, and the results were evaluated using the following three-level (○, Δ, x) grading system.

○: Less than 1Ω
Δ: 1Ω or higher, but less than 5Ω
x: 5Ω or higher

TABLE 3

|  | Working Example | | | | | Comparative Example | | | | | |
| --- | --- | --- | --- | --- | --- | --- | --- | --- | --- | --- | --- |
|  | 1 | 2 | 3 | 4 | 5 | 1 | 2 | 3 | 4 | 5 | 6 |
| Mounting conditions | | | | | | | | | | | |
| Substrate | A | A | A | A | A | A | A | B | C | A | A |
| ACF | a | a | a | b | b | a | a | a | a | b | c |
| Stage temperature (° C.) | 100 | 140 | 220 | 120 | 80 | 40 | 80 | 40 | 40 | 60 | 40 |
| Head temperature (° C.) | 280 | 280 | 280 | 280 | 280 | 280 | 280 | 280 | 280 | 280 | 280 |
| Evaluation | | | | | | | | | | | |
| Substrate warpage (μm) | 0~2 | 0~2 | 0~2 | 0~2 | 0~2 | 12 | 10 | 5 | 5 | 8~10 | 0 |
| Conduction reliability (before THT) | ○ | ○ | ○ | ○ | ○ | ○ | ○ | ○ | ○ | ○ | ○ |
| Conduction reliability (after THT) | ○ | ○ | ○ | ○ | ○ | ○ | ○ | ○ | ○ | Δ | X |

The results in Table 3 demonstrate that setting the stage temperature to a level above the inflection point temperature of an ACF in accordance with the working examples results in significantly reduced substrate warpage and excellent conduction reliability. It can also be seen that using an ACF of low elastic modulus accordance with Comparative Example 6 eliminates substrate warpage but yields very low conduction reliability following the THT test.

Mounting IC chips and other packaging components on a substrate by thermocompression bonding with an interposed thermosetting adhesive in accordance with the packaging method of the present invention can prevent substrate warpage while maintaining high connection reliability.

The entire disclosure of the specification, the claims, the drawings and the summary of Japanese Patent Application No. 11-118651 filed on Apr. 26, 1999 is hereby incorporated by reference.

What is claimed is:

1. A packaging method for thermocompression bonding of a substrate and packaging components between a stage and a head by means of an interposed thermosetting cured adhesive, wherein a stage temperature of the stage during thermocompression bonding is set above a temperature corresponding to an inflection point of an elastic modulus of the cured adhesive in a relationship between the elastic modulus and a temperature of the curved adhesive.

2. A packaging method according to claim 1, wherein the stage temperature during thermocompression bonding is set below a maximum temperature achieved by the thermosetting adhesive during thermocompression bonding.

3. A packaging method according to claim 2, wherein the elastic modulus of the substrate at normal temperature is 100 Gpa or lower, a thickness is 1.0 mm or less.

4. A packaging method according to claim 1, wherein the elastic modulus of the cured thermosetting adhesive at normal temperature is 1.0 Gpa or higher, a glass transition point is 80° C. or higher.

5. A packaging method according to claim 1, wherein the elastic modulus of the substrate at normal temperature is 100 Gpa or lower, a thickness is 1.0 mm or less.

6. A packaging method according to claim 5, wherein the substrate is a glass substrate.

* * * * *